United States Patent
Chen et al.

(10) Patent No.: US 9,887,009 B2
(45) Date of Patent: Feb. 6, 2018

(54) MEMORY PAGE BUFFER WITH SIMULTANEOUS MULTIPLE BIT PROGRAMMING CAPABILITY

(71) Applicant: Macronix International Co., Ltd., Hsinchu (TW)

(72) Inventors: Chung-Kuang Chen, Hsinchu (TW); Han-Sung Chen, Hsinchu (TW); Chung-Hsiung Hung, Jhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 619 days.

(21) Appl. No.: 14/513,899

(22) Filed: Oct. 14, 2014

(65) Prior Publication Data

US 2016/0103763 A1    Apr. 14, 2016

(51) Int. Cl.
| | | |
|---|---|---|
| *G11C 16/10* | (2006.01) | |
| *G11C 16/24* | (2006.01) | |
| *G11C 16/34* | (2006.01) | |
| *G11C 7/10* | (2006.01) | |
| *G11C 11/56* | (2006.01) | |
| *G11C 16/32* | (2006.01) | |

(52) U.S. Cl.
CPC .......... *G11C 16/10* (2013.01); *G11C 7/1084* (2013.01); *G11C 11/5628* (2013.01); *G11C 16/24* (2013.01); *G11C 16/3459* (2013.01); *G11C 16/32* (2013.01); *G11C 2211/5621* (2013.01)

(58) Field of Classification Search
CPC ... G11C 16/10; G11C 11/5628; G11C 7/1084; G11C 16/24; G11C 16/3459; G11C 2211/5621; G11C 16/32
See application file for complete search history.

(56) References Cited

U.S. PATENT DOCUMENTS

| | | |
|---|---|---|
| 7,639,533 B2 | 12/2009 | Chang et al. |
| 8,279,675 B2 | 10/2012 | Lee et al. |
| 8,792,285 B2 | 7/2014 | Hung |
| 9,627,072 B2 | 4/2017 | Chang et al. |
| 2001/0014037 A1 | 8/2001 | Kim et al. |
| 2005/0248991 A1 | 11/2005 | Lee et al. |
| 2006/0146609 A1* | 7/2006 | Lee ............... G11C 16/10 365/185.17 |
| 2006/0221697 A1 | 10/2006 | Li et al. |
| 2007/0019474 A1 | 1/2007 | Kim et al. |
| 2007/0091681 A1 | 4/2007 | Gongwer et al. |
| 2007/0147121 A1 | 6/2007 | Futatsuyama |
| 2008/0144370 A1 | 6/2008 | Park et al. |
| 2009/0031075 A1 | 1/2009 | Kim |
| 2009/0201725 A1 | 8/2009 | Chang et al. |
| 2009/0285021 A1 | 11/2009 | Lim |
| 2010/0027339 A1 | 2/2010 | Ho et al. |

(Continued)

*Primary Examiner* — Richard Elms
*Assistant Examiner* — Ajay Ojha
(74) *Attorney, Agent, or Firm* — Haynes Beffel & Wolfeld LLP

(57) ABSTRACT

One aspect of the technology is a memory device, which comprises a plurality of page buffers and control circuitry. Different page buffer circuits in the plurality of page buffer circuits are coupled to different bit lines in a plurality of bit lines in a memory array. The control circuitry is responsive to a program command to program multiple cells in the memory array, by setting, via the plurality of page buffer circuits, different target voltages at a same time for the different bit lines coupled to the multiple cells.

12 Claims, 13 Drawing Sheets

(56) References Cited

U.S. PATENT DOCUMENTS

| | | | |
|---|---|---|---|
| 2010/0182841 A1 | 7/2010 | Lee | |
| 2010/0195388 A1* | 8/2010 | Jung | G11C 11/5628 |
| | | | 365/185.03 |
| 2010/0302852 A1 | 12/2010 | Oh | |
| 2014/0022842 A1* | 1/2014 | Jung | G11C 16/10 |
| | | | 365/185.03 |
| 2016/0071581 A1* | 3/2016 | Lee | G11C 11/5671 |
| | | | 365/185.03 |

* cited by examiner

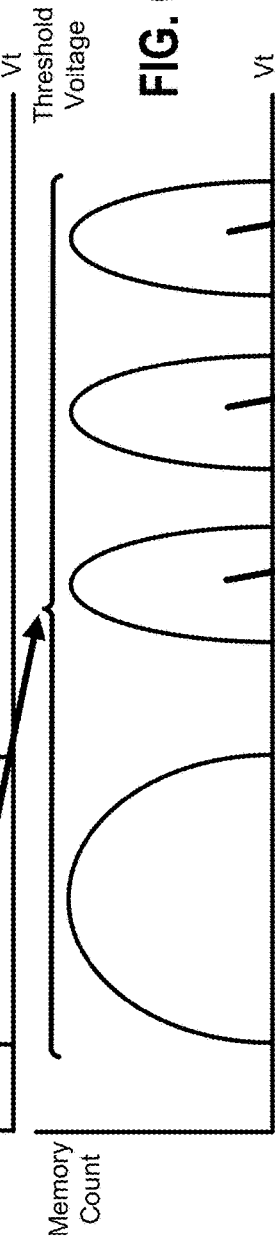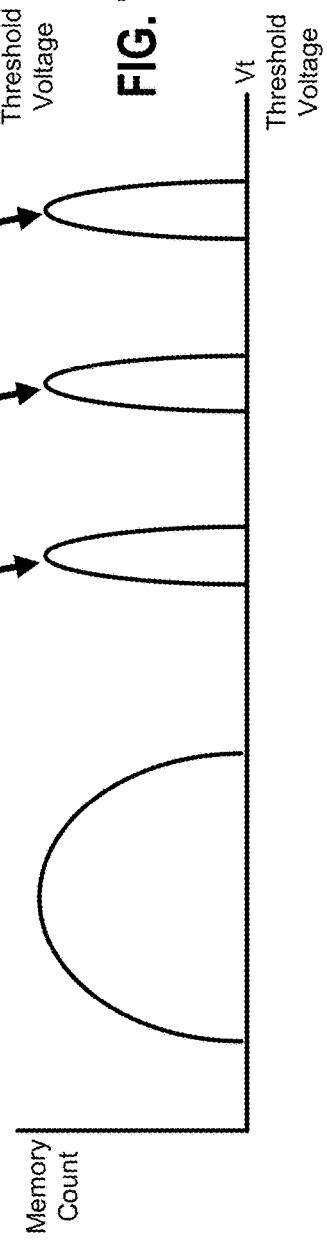

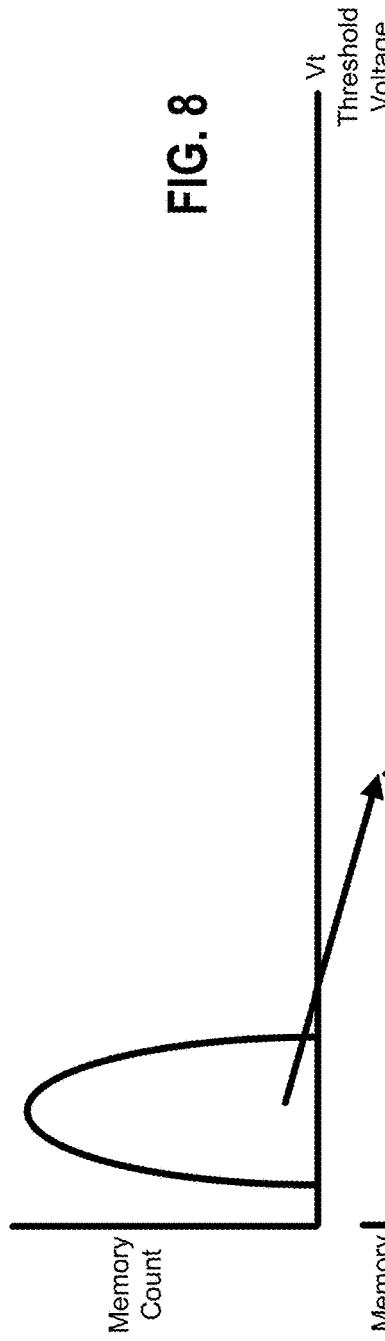
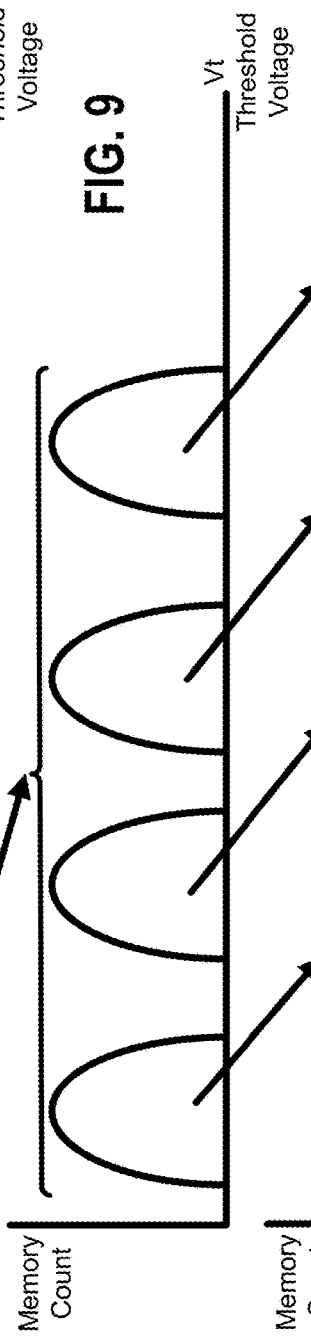
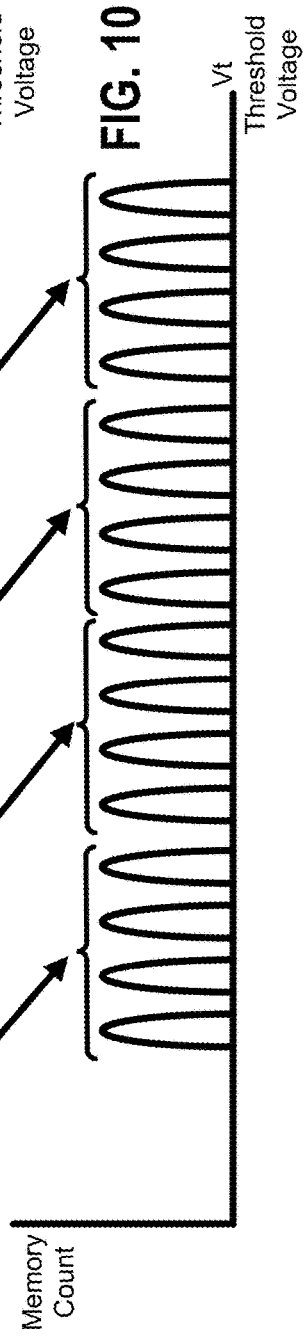

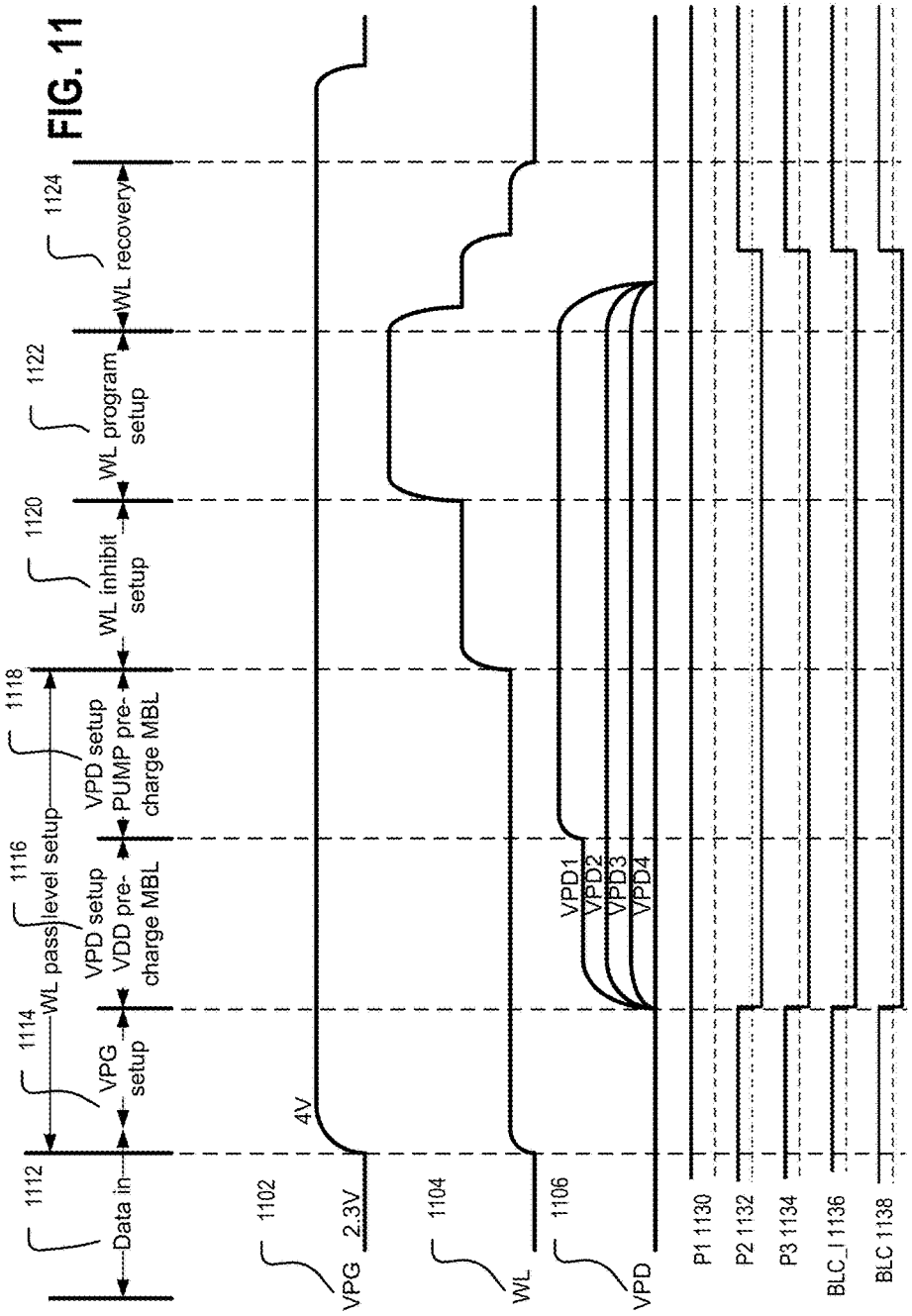

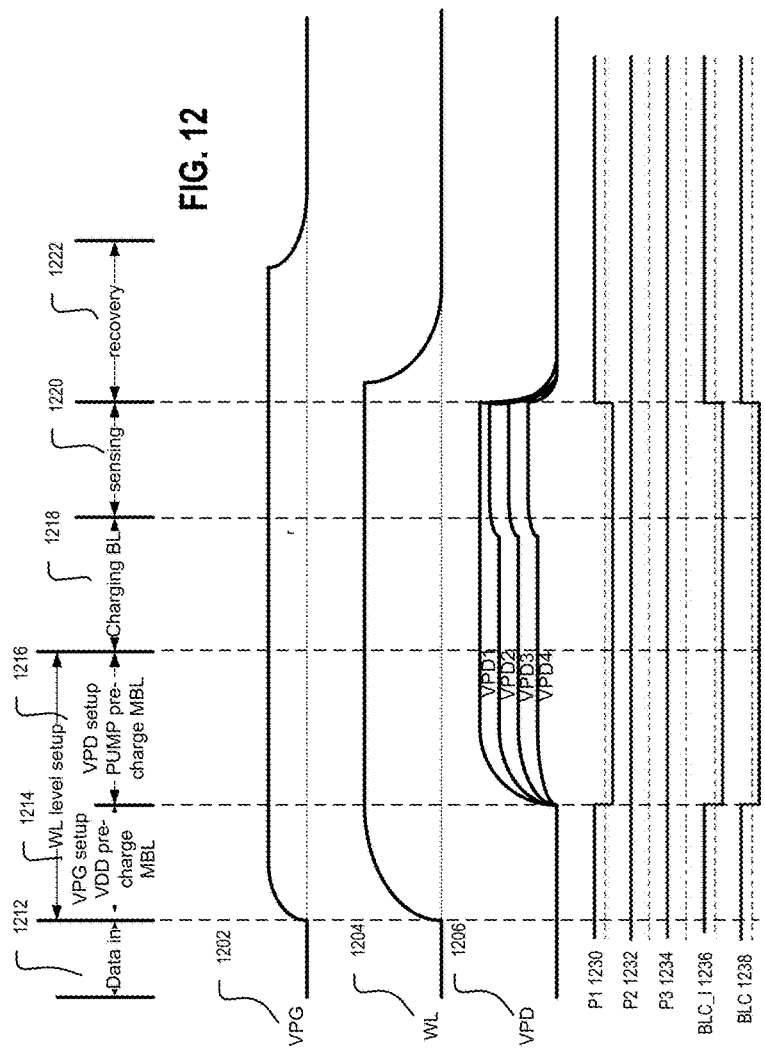

MEMORY PAGE BUFFER WITH SIMULTANEOUS MULTIPLE BIT PROGRAMMING CAPABILITY

BACKGROUND

Field of the Invention

This technology relates to a page buffer of a memory array.

Description of Related Art

Higher data densities result from the increasing number of bits per cell that can be stored on a nonvolatile memory array. However, an increased number of bits per cell carries the drawback of an increased delay during program and program verify steps.

A 1 bit per cell SLC (single level cell) stores 1 of 2 logical levels per cell, such that only one program level and program verify level exists. More bits per cell correspond to more program levels and program verify levels. For example, a 2 bits per cell MLC (multi level cell) stores 1 of 4 logical levels per cell; a 3 bits per cell TLC (triple level cell) stores 1 of 8 logical levels per cell; and a 4 bits per cell or 4LC (four level cell) stores 1 of 16 logical levels per cell. In contrast with SLC memory, memory cells that store multiple bits per cell have more than a single program level; multiple program levels and program verify levels exist.

The duration of a program step and a program verify step increases with the number of logical levels per cell. So as the number of bits per cell increase, the program step and the program verify step take longer. Similar difficulties exist with memory cells that store charge in different localized portions of the same memory cell.

It would be desirable to take advantage of the increased memory density of memory cells that store multiple bits per cell, without suffering a correspondingly increased duration of the program step and program verify step.

SUMMARY

One aspect of the technology is a memory device, which comprises a plurality of page buffers and control circuitry.

Different page buffer circuits in the plurality of page buffer circuits are coupled to different bit lines in a plurality of bit lines in a memory array.

The control circuitry is responsive to a program command to program multiple cells in the memory array, by setting, via the plurality of page buffer circuits, different target voltages at a same time for the different bit lines coupled to the multiple cells.

Another aspect of the technology is a method, comprising:
  receiving a program command to program multiple memory cells coupled to different bit lines in a memory array;
  responsive to the program command, setting different target voltages at a same time for the different bit lines coupled to the multiple memory cells.

In one embodiment of the technology, the different target voltages are different program levels, such that the control circuitry sets different program levels at the same time for the different bit lines. In another embodiment of the technology, the different target voltages are different program verify levels, such that the control circuitry sets different program verify levels at the same time for the different bit lines.

In one embodiment of the technology, the different target voltages for the different bit lines are determined by bits stored in respective page buffer circuits of the plurality of page buffer circuits.

In one embodiment of the technology, the different target voltages correspond to different logical values that the control circuitry programs to different ones of the multiple cells responsive to the program command.

In one embodiment of the technology, via a plurality of page buffer circuits coupled to the different bit lines, the different target voltages are set at the same time for the different bit lines. In one embodiment of the technology, the different target voltages for the different bit lines are determined by bits stored in respective page buffer circuits of the plurality of page buffer circuits.

A further aspect of the technology is memory device, comprising a page buffer circuit of a bit line in a memory array. The page buffer circuit includes a plurality of memory elements storing a plurality of bits, a plurality of electrical inputs of the page buffer circuit, and a selection circuit that selects a particular electrical input of the plurality of electrical inputs based on the plurality of bits in the plurality of memory elements. Different ones of the plurality of electrical inputs correspond to different signals that result in different bit line voltages of the bit line.

Yet another aspect of the technology is a method, comprising:
  receiving a program command to program a data value to a memory cell in a memory array, the memory cell coupled to a bit line in the memory array;
  responsive to the program command, storing a plurality of bits corresponding to the data value in a page buffer circuit coupled to the bit line; and
  responsive to the program command, selecting a particular electrical input of a plurality of electrical inputs of the page buffer circuit coupled to the bit line, based on the plurality of bits in the page buffer circuit, wherein the particular electrical input determines a bit line voltage of the bit line.

In one embodiment of the technology, the different signals at the plurality of electrical inputs correspond to different program levels on the bit line, such that the selection circuit selecting the particular electrical input of the plurality of electrical inputs, results in selecting the one of the different program levels on the bit line. In another embodiment of the technology, the different signals at the plurality of electrical inputs correspond to different program verify levels on the bit line, such that the selection circuit selecting the particular electrical input of the plurality of electrical inputs, results in selecting the one of the different program verify levels on the bit line.

One embodiment of the technology further comprises control circuitry sending control signals to store the plurality of bits in the plurality of memory elements, and to cause the selection circuit to select the particular electrical input. Another embodiment of the technology further comprises control circuitry, that responsive to a program command to store a particular data value to a memory cell coupled to the bit line, causes the bit line to have said one of the bit line voltages that corresponds to the particular data value.

Yet another aspect of the technology is a method of manufacturing a memory device as described herein.

BRIEF DESCRIPTION OF THE DRAWINGS

FIGS. 5-7 are sequential threshold voltage windows of memory count versus threshold voltage, illustrating a multiple phase scheme to programming a multi-level cell (MLC).

FIGS. 8-10 are sequential threshold voltage windows of memory count versus threshold voltage, illustrating a multiple phase scheme to programming a four level cell (4LC).

FIG. 11 is a graph of example waveforms while programming multiple different target values in parallel.

FIG. 12 is a graph of example waveforms while program verifying multiple different target values in parallel.

DETAILED DESCRIPTION

Figure 1:
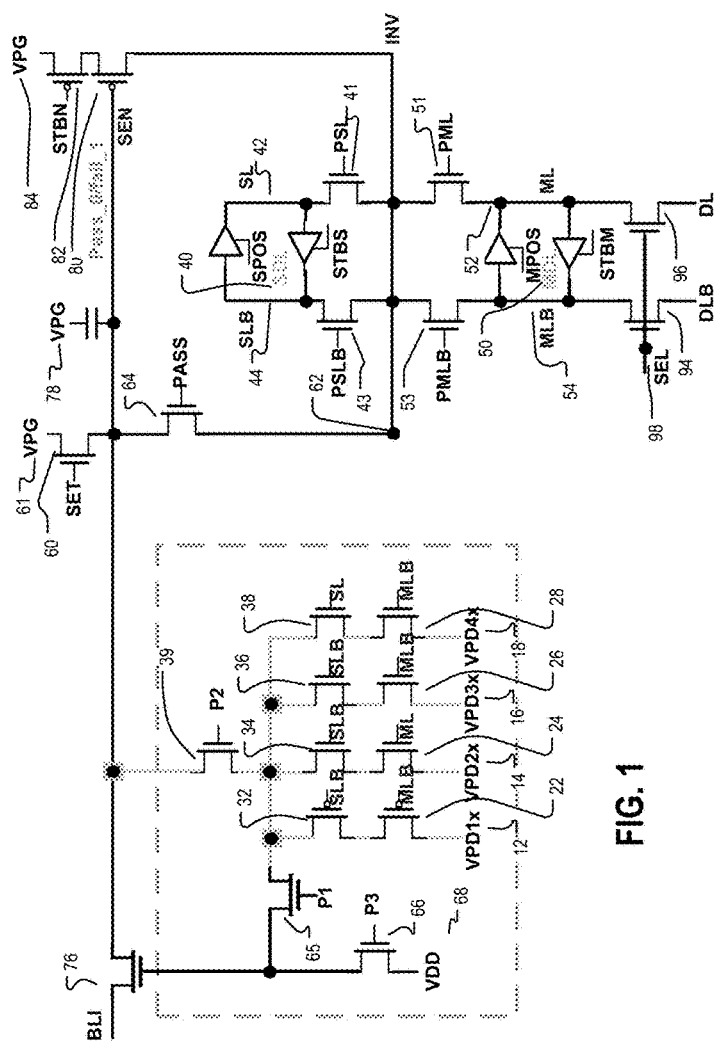
FIG. 1 is a circuit diagram of an example page buffer having a voltage sensing configuration.

FIG. 1 is a circuit diagram of an example page buffer having a voltage sensing configuration. The page buffer stores data bits to be programmed and/or program verified with nonvolatile memory via a bit line.

A master data latch MDL 50 and a slave data latch SDL 40 each stores 1 data bit, or a total of 2 data bits, which in combination represent a value to be programmed or program verified with a memory cell. The 2 data bits in combination can represent any one of 2^2 logical values that can be stored in a MLC memory cell.

Other embodiments can store 3 data bits which in combination can represent one of 2^3 logical values that can be stored in a TLC memory cell, 4 data bits which in combination can represent one of 2^4 logical values that can be stored in a 4LC memory cell, or generally n data bits which in combination can represent one of 2^n logical values that can be stored in a memory cell.

Other embodiments use memory elements other than latches.

The master data latch MDL 50 has nodes ML 52 and MLB 54, which are complements. The slave data latch MDL 50 has nodes ML 52 and MLB 54, which are complements.

The voltage of the bit line coupled to transistor is determined by the selection circuit including transistors 22, 24, 26, 28, 32, 34, 36, and 38. Transistors 22 and 32 are p-type; and transistors 24, 34, 26, 36, 28, and 38 are n-type, In this embodiment, there are 4 selectable inputs in parallel, corresponding to the 2^2 logical values that can be stored in a MLC memory cell. Each of the 4 selectable inputs has 2 transistors in series, corresponding to the 2 bits that can be stored in a MLC memory cell.

In another embodiment, there are 8 selectable inputs in parallel, corresponding to the 2^3 logical values that can be stored in a TLC memory cell. Each of the 8 selectable inputs has 3 transistors in series, corresponding to the 3 bits that can be stored in a TLC memory cell.

In yet another embodiment, there are 16 selectable inputs in parallel, corresponding to the 2^4 logical values that can be stored in a 4LC memory cell. Each of the 16 selectable inputs has 4 transistors in series, corresponding to the 4 bits that can be stored in a 4LC memory cell.

In a further embodiment, there are 2^n selectable inputs in parallel, corresponding to the are 2^n logical values that can be stored in a memory cell that stores of are 2^n logical levels. Each of the are 2^n selectable inputs has n transistors in series, corresponding to the n bits that can be stored in the memory cell.

As stated above, the master data latch MDL 50 and a slave data latch SDL 40 can store 2 data bits in combination can represent any one of 2^2 logical values that can be stored in a MLC memory cell. Each of the 2^2 logical values that can be stored in the combination of the master data latch MDL 50 and a slave data latch SDL 40 can select one of the 4 selectable inputs receiving signals in parallel.

The leftmost selectable input receives signal VPD1x 12. This path includes, in series, transistor 22 receiving MLB and transistor 32 receiving SLB. Because the transistors are p-type, this path is turned on when MLB is low and SLB is low, or ML is high and SL is high.

The second leftmost selectable input receives signal VPD2x 14. This path includes, in series, transistor 24 receiving ML and transistor 34 receiving SLB. Because the transistors are n-type, this path is turned on when ML is high and SLB is high, or ML is high and SL is low.

The second rightmost selectable input receives signal VPD3x 16. This path includes, in series, transistor 26 receiving MLB and transistor 36 receiving SLB. Because the transistors are n-type, this path is turned on when MLB is high and SLB is high, or ML is low and SL is low.

The rightmost selectable input receives signal VPD4x 18. This path includes, in series, transistor 28 receiving MLB and transistor 38 receiving SL. Because the transistors are n-type, this path is turned on when MLB is high and SL is high, or ML is low and SL is high.

The exact correspondence between the particular combinations of bits stored in the master data latch MDL 50 and a slave data latch SDL 40, and the path turned on by a particular combination of bits, can be varied, or example by changing the signals, changing the nodes, changing n-type and p-type devices.

Also, the exact correspondence between the particular combinations of bits stored in the master data latch MDL 50 and a slave data latch SDL 40, and the particular logical value 0, 1, 2, 3 stored in the MLC memory cell can be varied.

Multiple different signals are received at the same time by the multiple electrical inputs. The particular combination of bits stored in the master data latch MDL 50 and a slave data latch SDL 40 automatically selects the correct path or electrical input receiving the correct signal corresponding to the particular combination of bits stored in the master data latch MDL 50 and a slave data latch SDL 40. The multiple different signals result in different voltages on the bit line, such that a program operation or a program verify operation is performed with the corresponding voltage on the bit line.

Figure 2:
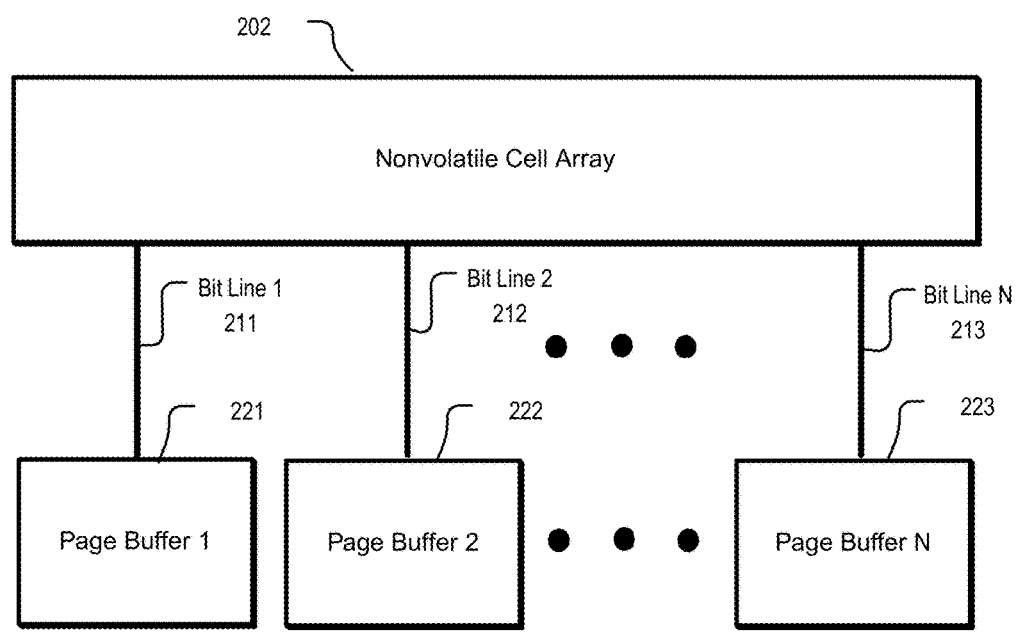
FIG. 2 is a simplified block diagram with a memory array coupled to multiple page buffers such as the page buffer circuit of FIG. 1.

FIG. 2 is a simplified block diagram with a memory array coupled to multiple page buffers such as the page buffer circuit of FIG. 1.

The nonvolatile cell array 202 has an array of nonvolatile cells, which can be MLC memory cells storing 2 data bits. Other embodiments can be TLC memory cells storing 3 data bits, 4LC memory cells storing 4 data bits, or other memory cells storing more bits.

Page buffers access the nonvolatile cell array 202 via corresponding bit lines. Page buffer 1 221 accesses the nonvolatile cell array 202 via bit line 1 211. Page buffer 2 222 accesses the nonvolatile cell array 202 via bit line 2 212. Page buffer N 223 accesses the nonvolatile cell array 202 via bit line N 213.

As described in connection with FIG. 1, each page buffer receives 4 different signals on 4 different electrical inputs. The 2 bits stored in the page buffer automatically select the correct electrical input with the correct signal. The correct signal results in the correct voltage on the bit line used by the page buffer to access the memory array for a program or program verify operation.

The multiple page buffers in parallel can program or program verify different logical values at the same time by setting different target voltages on different bit lines at the same time. For example, page buffer 1 221 can set a first target value for bit line 1 211 at the same time that page buffer 2 222 sets a different, second target value for bit line 2 212.

Figure 3:
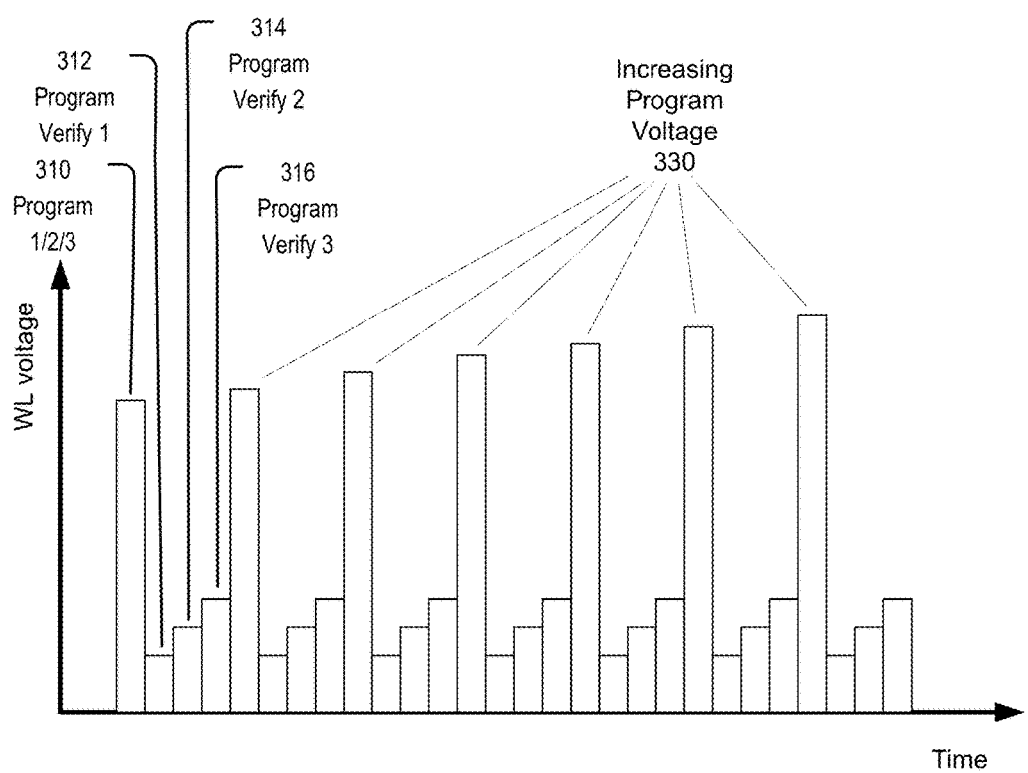
FIG. 3 is a graph of word line voltage versus time for the page buffer circuit of FIG. 1, showing the increased speed of the program operation resulting from programming multiple different target values in parallel.

FIG. 3 is a graph of word line voltage versus time for the page buffer circuit of FIG. 1, showing the increased speed of the program operation resulting from programming multiple different target values in parallel.

Multiple page buffers in parallel can set different bit lines to different voltages at the same time. Multiple page buffers can program different logical values to memory cells accessed by different bit lines at the same time. The graph shows a shared period 310 during which any combination of 3 different logical values can be programmed via different bit lines at the same time. Parallel programming of 3 different logical values at the same time is faster than sequential programming of logical value 1, logical value 2, and logical value 3.

Subsequently, during 312 program verify of logical value 1 is performed. During 314 program verify of logical value 2 is performed. During 316 program verify of logical value 3 is performed.

In the event that program verify fails for at least one memory cell, the sequence is repeated on the failed memory cells of a parallel program of logical values 1/2/3 at the same time, followed in sequence by program verify of logical value 1, logical value 2, and logical value 3. With each repetition, the program voltage increases 330.

Figure 4:
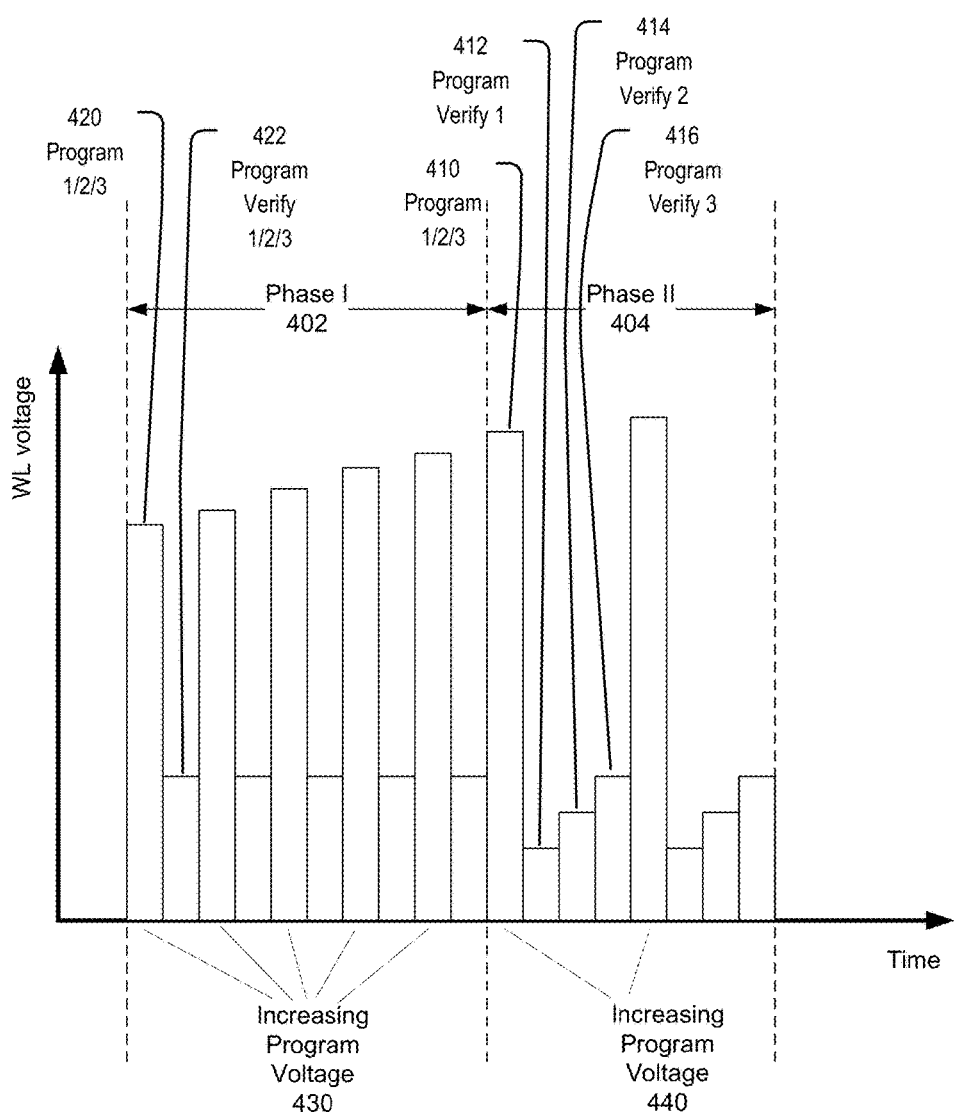
FIG. 4 is a graph of word line voltage versus time for the page buffer circuit of FIG. 1, showing the increased speed of the program operation resulting from programming multiple different target values in parallel, and the increased speed of the program verify operation resulting from verifying multiple different target values in parallel.

FIG. 4 is a graph of word line voltage versus time for the page buffer circuit of FIG. 1, showing the increased speed of the program operation resulting from programming multiple different target values in parallel, and the increased speed of the program verify operation resulting from verifying multiple different target values in parallel.

The graph includes multiple phases of program and program verify, Phase I 402 and Phase II 404. The program verify operation is faster in Phase I 402 than in Phase II 404. However, the program verify operation is also less precise in Phase I 402 than in Phase II 404. In Phase I 402, relatively wide threshold voltage ranges are programmed and program verified. In Phase II 404, relatively narrow threshold voltage ranges are programmed and program verified. Example threshold voltage windows which benefit from such multiple phases of program and program verify are shown in FIGS. 5-7 and 8-10.

Phase I 402 includes multiple sequences of parallel programming multiple values at the same time, and parallel program verifying of multiple values at the same time.

The graph shows a shared period 420 during which any combination of 3 different logical values can be programmed via different bit lines at the same time. Parallel programming of 3 different logical values at the same time is faster than sequential programming of logical value 1, logical value 2, and logical value 3.

The graph also shows a shared period 422 during which any combination of 3 different logical values can be program verified via different bit lines at the same time. Parallel program verifying of 3 different logical values at the same time is faster than sequential program verifying of logical value 1, logical value 2, and logical value 3.

In the event that program verify fails for at least one memory cell, the sequence is repeated on the failed memory cells of a parallel program of logical values 1/2/3 at the same time, and a parallel program verify of logical values 1/2/3 at the same time. With each repetition, the program voltage increases 430.

Phase II 404 includes multiple sequences of parallel programming multiple values at the same time, and sequential program verifying of multiple values at different times.

The graph shows a shared period 410 during which any combination of 3 different logical values can be programmed via different bit lines at the same time.

Subsequently, during 412 program verify of logical value 1 is performed. During 414 program verify of logical value 2 is performed. During 416 program verify of logical value 3 is performed.

In the event that program verify fails for at least one memory cell, the sequence is repeated on the failed memory cells of a parallel program of logical values 1/2/3 at the same time, and sequential program verify of logical values 1/2/3 at different times. With each repetition, the program voltage increases 440.

In other embodiments with more than 4 logical values, the number of logical values that are programmed in parallel, program verified in parallel, and program verified in sequence, increases.

FIGS. 5-7 are sequential threshold voltage windows of memory count versus threshold voltage, illustrating a multiple phase scheme to programming a multi-level cell (MLC).

FIG. 5 shows a threshold voltage window and memory count with all memory cells being in an erased state, in a lowest threshold voltage window.

FIG. 6 shows the result of performing a first phase of program and program verify sequences on the memory cells of FIG. 5. An example first phase is shown in Phase 1 402 of FIG. 4. After the first phase, some cells which were in the erased state have been programmed to various logical levels with correspondingly higher threshold voltage ranges. The resulting threshold voltage ranges of the programmed and program verified memory cells are relatively wide.

FIG. 7 shows the result of performing a second phase of program and program verify sequences on the memory cells of FIG. 6. An example second phase is shown in Phase I1 404 of FIG. 4. After the second phase, cells which were programmed before to various logical levels continue to store the same respective logical levels. However, within the less programmed memory cells of each logical level are programmed slightly. The threshold voltages of memory cells at the lower end of the threshold voltage range in FIG. 6 are raised slightly. The resulting threshold voltage ranges of the programmed and program verified memory cells are relatively narrow.

After the multi-phase scheme of FIG. 5-7, an array of MLC cells have been programmed, such that the MLC cells store any of 4 logical values.

FIGS. 8-10 are sequential threshold voltage windows of memory count versus threshold voltage, illustrating a multiple phase scheme to programming a four level cell (4LC).

FIG. 8 shows a threshold voltage window and memory count with all memory cells being in an erased state, in a lowest threshold voltage window.

FIG. 9 shows the result of performing a first phase of program and program verify sequences on the memory cells of FIG. 8. An example first phase is shown in Phase 1 402 of FIG. 4. After the first phase, some cells which were in the erased state have been programmed to various threshold voltage ranges. The resulting threshold voltage ranges of the programmed and program verified memory cells are relatively wide. Following the first phase of program and program verify sequences on the memory cells of FIG. 8 in 1 threshold voltage range, FIG. 9 shows 4 threshold voltage ranges.

FIG. 10 shows the result of performing a second phase of program and program verify sequences on the memory cells of FIG. 9. An example second phase is shown in Phase I1 404 of FIG. 4. During the second phase, for each particular wide threshold voltage range of the 4 wide threshold voltage ranges, cells which were in the particular wide threshold voltage range, are programmed to divide the cells among 4 narrow threshold voltage ranges. Each of the wide threshold voltage ranges in FIG. 9 is followed by its own particular corresponding set of 4 narrow threshold voltage ranges. Accordingly, after the second phase, the number of possible narrow threshold voltage ranges is 16. (4 wide threshold voltages*(4 narrow threshold voltage ranges per wide threshold voltage range)) The resulting threshold voltage ranges of the programmed and program verified memory cells are relatively narrow.

After the multi-phase scheme of FIG. 8-10, an array of 4LC cells have been programmed, such that the 4LC cells store any of 16 logical values.

FIG. 11 is a graph of example waveforms while programming multiple different target values in parallel.

The waveforms are page buffer power VPG 1102, word line voltage WL 1104, and bit line power setup 1106 VPD. Control signal waveforms include P1 1130, P2 1132, P3 1134, BLC_I 1136, and BLC 1138.

The programming waveforms include a sequence of phases. At 1112, data bits are transferred into the page buffer latches, that are to be programmed into memory cells. At 1114, page buffer power VPG undergoes setup. The period 1116 is initiated by the control signals: P1 1130 remains high; and P2 1132, P3 1134, BLC_I 1136, and BLC 1138 go from high to low. At 1116 and 1118, bit line power VPD undergoes setup. In particular, multiple bit line powers VPD1, VPD2, VPD3, and VPD4 are setup. The multiple bit line powers are received at the same time by each of the different page buffers, which select the appropriate bit line power based on the latched bits within the different page buffers for use during the program operation. Also at 1116, supply voltage VDD precharges the main bit lines MBL. At 1118, a charge pump further precharges the main bit lines MBL.

At 1120, word line WL inhibit voltage undergoes setup. The word line WL inhibit voltage reduces program disturb of memory cells coupled to word lines that are not programming memory cells. At 1122, word line WL program voltage undergoes setup. At 1124, word line WL voltage undergoes recovery, down to ground. During the period 1124, P2 1132, P3 1134, BLC_I 1136, and BLC 1138 return from low to high.

FIG. 12 is a graph of example waveforms while program verifying multiple different target values in parallel.

The waveforms are page buffer power VPG 1202, word line voltage WL 1204, and bit line power setup 1206 VPD. Control signal waveforms include P1 1230, P2 1232, P3 1234, BLC_I 1236, and BLC 1238.

The program verify waveforms include a sequence of phases. At 1212, data in occurs. At 1214, page buffer power VPG undergoes setup, and supply voltage VDD precharges the main bit lines MBL. The period 1116 is initiated by the control signals: P2 1132 and P3 1134 remain high; and P1 1130, BLC_I 1136, and BLC 1138 go from high to low. At 1216 bit line power VPD undergoes setup, including multiple bit line powers VPD1, VPD2, VPD3, and VPD4. The multiple bit line powers are received at the same time by each of the different page buffers, which select the appropriate bit line power based on the latched bits within the different page buffers, for use during the program verify operation. Also at 1216, a charge pump further precharges the main bit lines MBL.

At 1218, bit lines BL are charged. At 1220, values in the programmed memory cells are sensed, performing the program verify. The period 1220 is initiated by the control signals: P1 1130, BLC I 1136, and BLC 1138 return from low to high. At 1222, page buffer power VPG 1202, word line voltage WL 1204, and bit line power setup 1206 VPD undergo recovery, down to ground.

Figure 13:
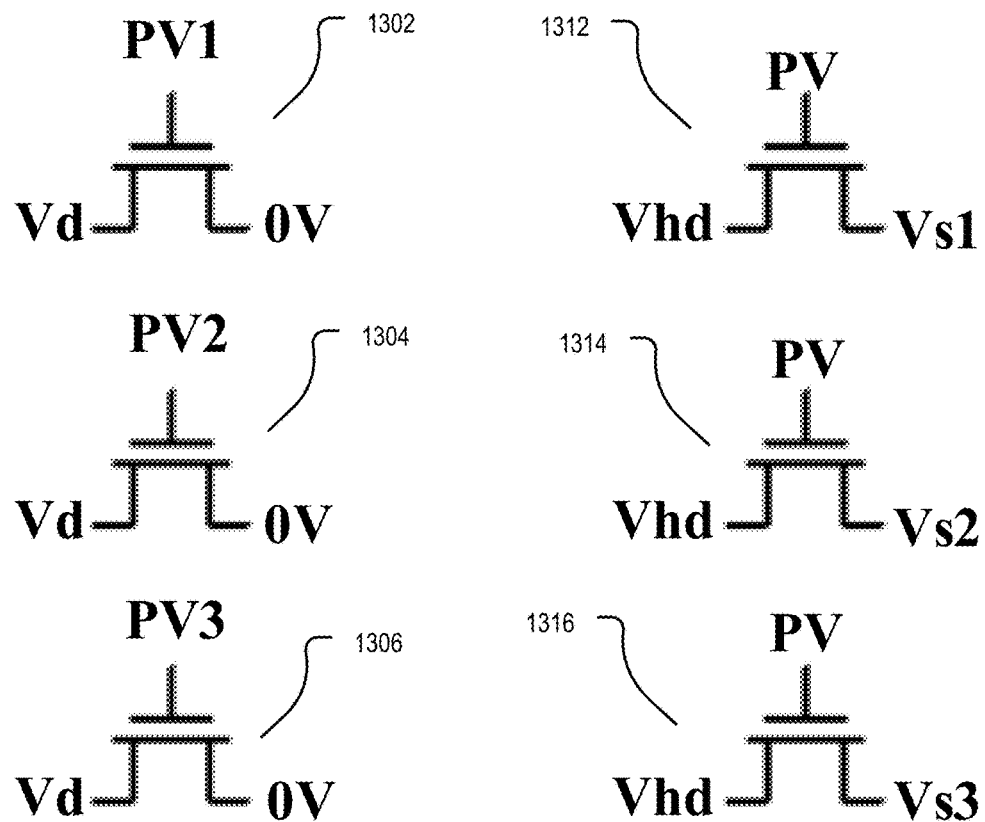
FIG. 13 shows simplified transistors undergoing different program verify biases depending on an amount of precision in the threshold voltage window.

FIG. 13 shows simplified transistors undergoing different program verify biases depending on an amount of precision in the threshold voltage window.

Among the memory cells of FIG. 13, the gate is biased by a word line, the source is biased by a bit line via a page buffer, and the drain is biased by a reference line.

Transistors 1302, 1304, and 1306 represent nonvolatile memory cells undergoing sequential program verify of different values at different times. Transistors 1312, 1314, and 1316 represent nonvolatile memory cells undergoing parallel program verify of different values at the same time.

An example of the biases of nonvolatile memory cells 1312, 1314, and 1316 occurs during Phase 1 402 of FIG. 4. The bit line voltage and thus the source voltage depends on the particular value which is expected to have been programmed, and is being program verified. The bit line bias and source is Vs1 for memory cell 1312, Vs2 for memory cell 1314, and Vs3 for memory cell 1316. The word line voltage is the same PV and the drain voltage is the same Vhd across nonvolatile memory cells 1312, 1314, and 1316.

An example of the biases of nonvolatile memory cells 1302, 1304, and 1306 occurs during Phase 2 404 of FIG. 4. The word line voltage and thus the gate voltage depends on the particular value which is expected to have been programmed, and is being program verified. The word line bias and gate is PV1 for memory cell 1302, PV2 for memory cell 1304, and PV3 for memory cell 1306. The source voltage is the same 0V and the drain voltage is the same Vd across nonvolatile memory cells 1302, 1304, and 1306.

Figure 14:
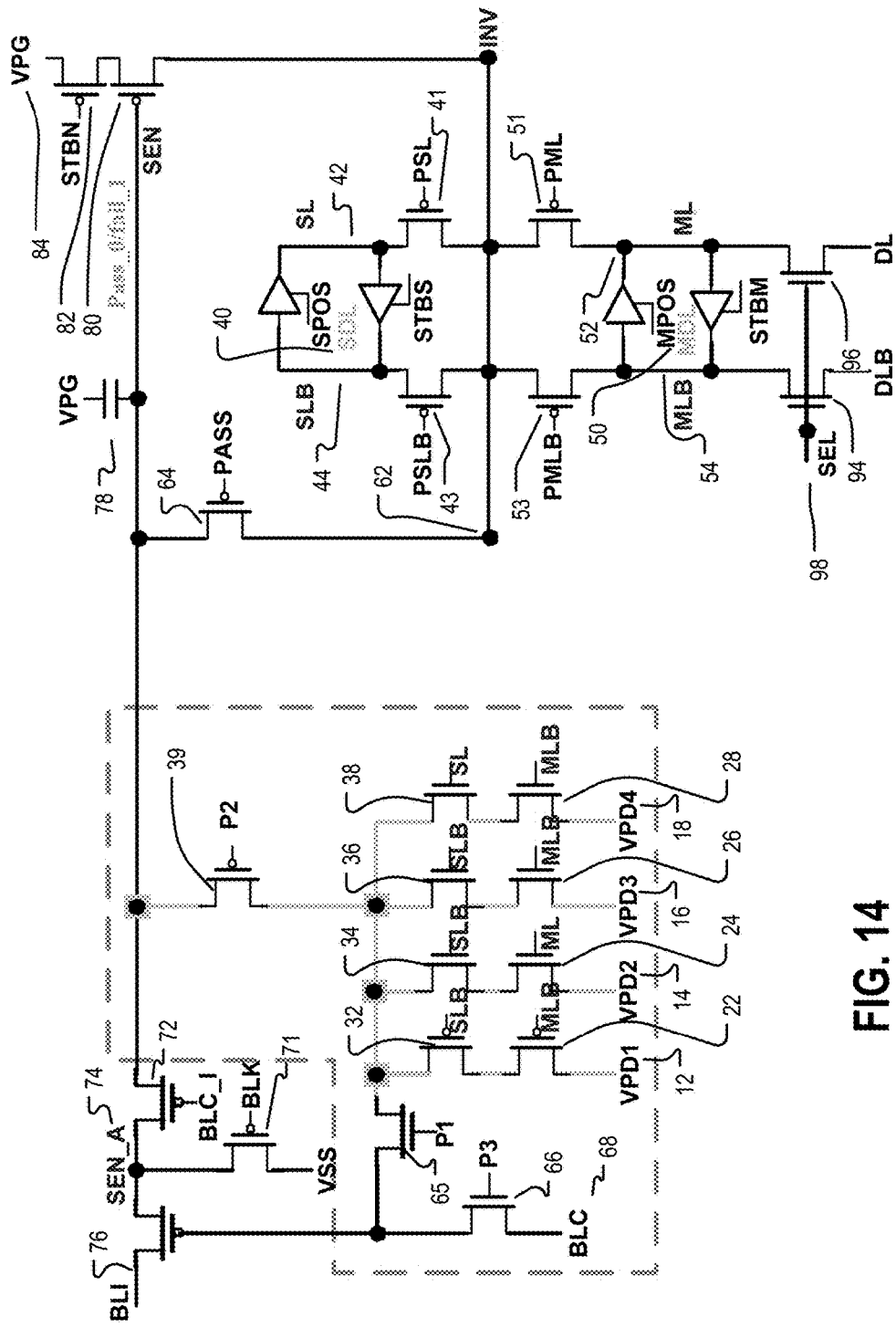
FIG. 14 is a circuit diagram of an example page buffer having a current sensing configuration without negative bias.

FIG. 14 is a circuit diagram of an example page buffer having a current sensing configuration without negative bias.

Data latch MDL 54, data latch SDL 44, and the selection circuit with transistors 22, 24, 26, 28, 32, 34, 36, and 38 are explained in connection with FIG. 1. Example operation is discussed in connection with FIGS. 16-30.

Compared to the page buffer of FIG. 1, this current sensing configuration includes additional transistors. P-type transistor 72 is in between node SEN_A and node SEN, and receiving BLC_I. P-type transistor 71 is in between node SEN_A and VSS.

Compared to the page buffer of FIG. 1, some transistors have the opposite doping type. Transistor P2 39 which receives P2, and is positioned between node SEN and the selection circuit, is p-type rather than n-type as in FIG. 1.

Transistor 76 positioned between a bit line node BLI and node SEN_A and having a gate coupled to current-carrying terminals of transistors P1 65 and P3 66.

A bias signal is also different. Transistor 66 which has a gate coupled to P3 and a current-carrying terminal coupled to the gate of transistor 76, has another current-carrying terminal coupled to BLC rather than VDD as in FIG. 1.

Figure 15:
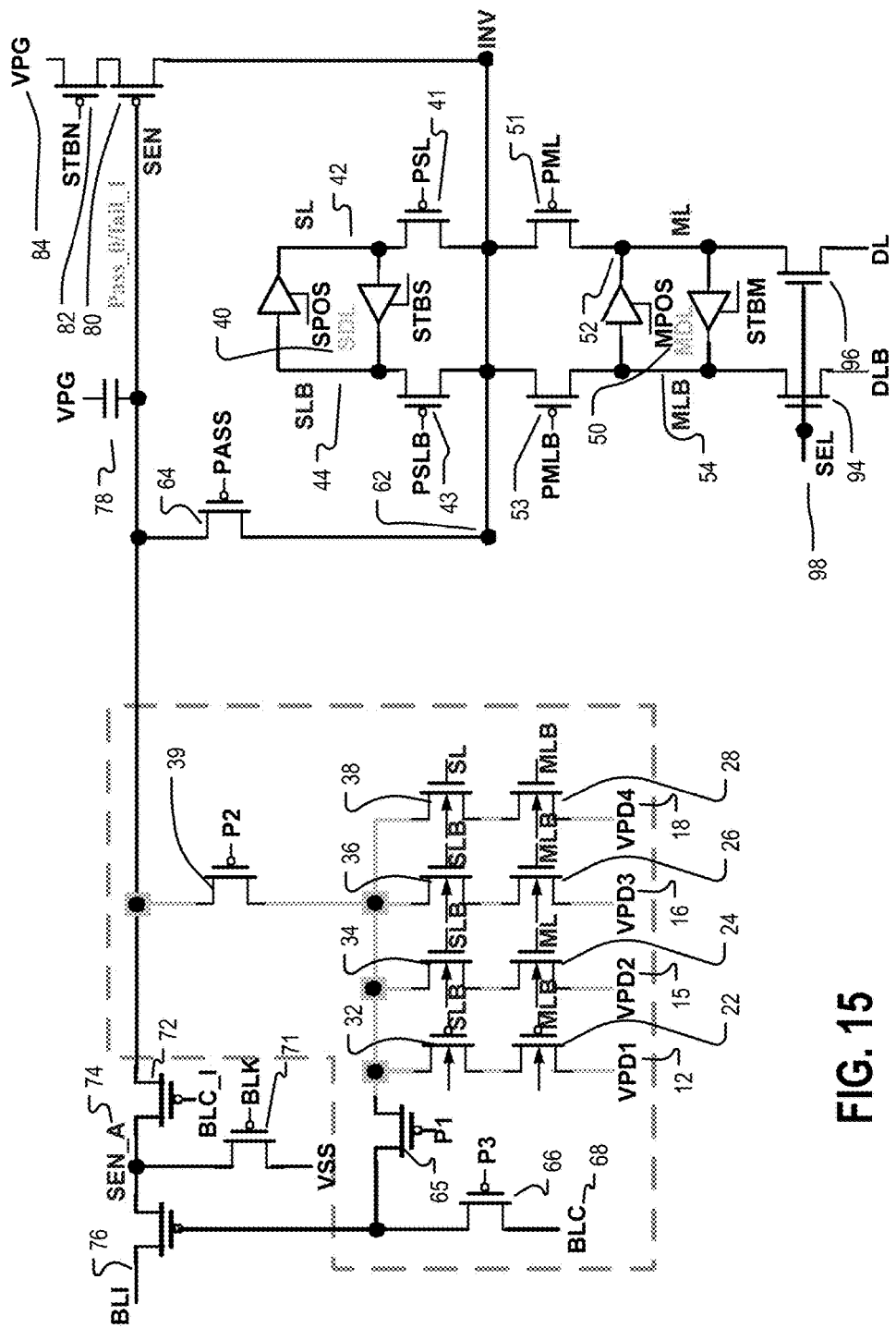
FIG. 15 is a circuit diagram of an example page buffer having a current sensing configuration with negative bias.

FIG. 15 is a circuit diagram of an example page buffer having a current sensing configuration with negative bias.

Compared to the page buffer of FIG. 14, some transistors have the opposite doping type.

Transistor 65 positioned between the selection circuit and the gate of transistor 76, and having a gate coupled to P1, is p-type rather than n-type as in FIG. 14.

Transistor 66 positioned between BLC and the gate of transistor 76, and having a gate coupled to P3, is p-type rather than n-type as in FIG. 14.

Figure 16:
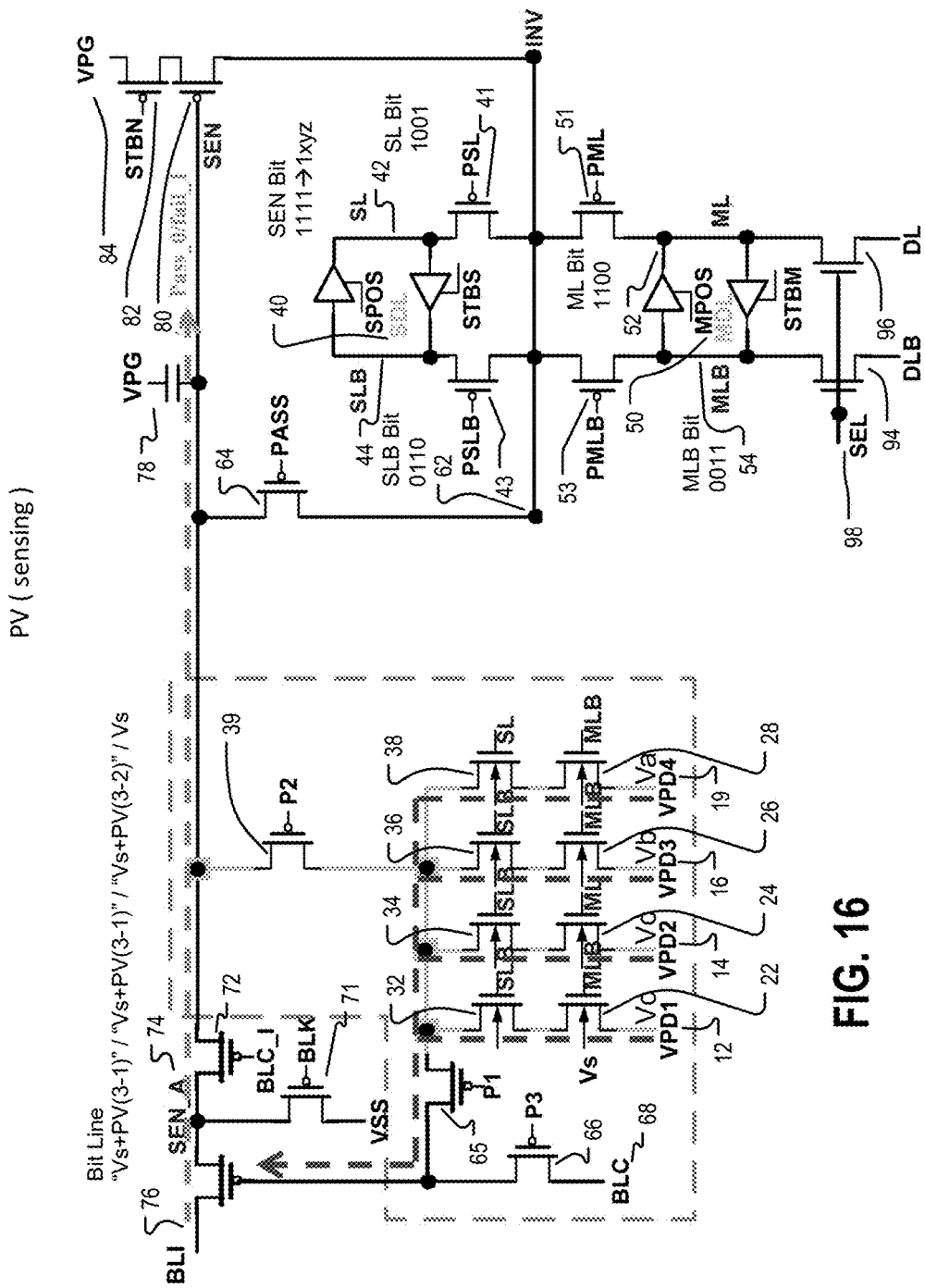
FIG. 16 is a circuit diagram of the example page buffer of FIG. 14, undergoing a first sensing operation.

FIG. 16 is a circuit diagram of the example page buffer of FIG. 14, undergoing a first sensing operation.

During the sensing operation, the voltage applied to the gate of transistor 76 depends on the selection circuit, which passes one of the input signals VPD1 12, VPD2 14, VPD3 16, and VPD4 18 to the gate of transistor 76.

In turn, the voltage at the gate of transistor 76 determines the state of transistor 76, and the degree of electrical coupling between the bit line and node SEN at the gate of p-type transistor 80.

At node SEN, SEN bit values change from 1111 to 1xyz.

Figure 17:
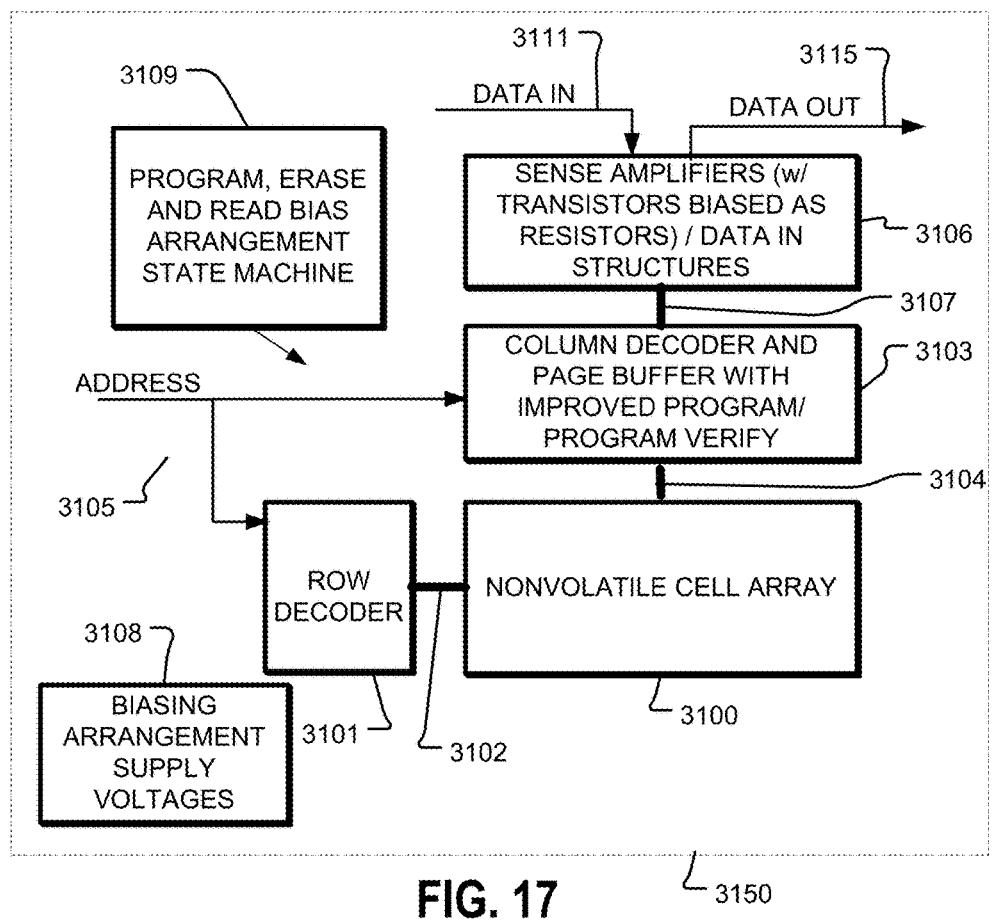
FIG. 17 is a simplified block diagram of an example integrated circuit with a page buffer having improved program speed and/or program verify speed.

FIG. 17 is a simplified block diagram of an example integrated circuit with a page buffer having improved program speed and/or program verify speed.

An integrated circuit 3150 includes a memory array 3100. A word line decoder and word line drivers 3101 is coupled to, and in electrical communication with, a plurality of word lines 3102, and arranged along rows in the memory array 3100. A bit line decoder and drivers 3103 are coupled to and in electrical communication with a plurality of bit lines 3104 arranged along columns in the memory array 3100 for reading data from, and writing data to, the memory cells in the memory array 3100. Addresses are supplied on bus 3105 to the word line decoder and drivers 3101 and to the bit line decoder 3103. Sense amplifiers which are coupled to transistors bias as resistors as disclosed herein, and data-in structures in block 3106, are coupled to the bit line decoder 3103 via the bus 3107. Data is supplied via the data-in line 3111 from input/output ports on the integrated circuit 3150, to the data-in structures in block 3106. Data is supplied via the data-out line 3115 from the sense amplifiers in block 3106 to input/output ports on the integrated circuit 3150, or to other data destinations internal or external to the integrated circuit 3150. Program, erase, and read bias arrangement state machine circuitry 3109 responds to a program command by performing program and program verify operations. The program operation can program multiple different target values at once on different bit lines. The program verify operation can program verify multiple different target values at once on different bit lines.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
a plurality of page buffer circuits, different page buffer circuits in the plurality of page buffer circuits coupled to different bit lines in a plurality of bit lines in a memory array;
voltage selection circuits coupled with corresponding page buffer circuits in the plurality of page buffer circuits, responsive to different data values stored in the corresponding page buffer circuits to select different target voltages;
control circuitry responsive to a program command to program multiple cells in the memory array, including applying, via the plurality of page buffer circuits and voltage selection circuits, different target voltages at a same time to the different bit lines coupled to the multiple cells.

2. The device of claim 1,
wherein the different target voltages are different bit line program voltage levels, such that the control circuitry sets different bit line program voltage levels at the same time for the different bit lines.

3. The device of claim 1,
wherein the different target voltages are different bit line program verify voltage levels, such that the control circuitry sets different bit line program verify voltage levels at the same time for the different bit lines.

4. A method, comprising:
receiving a program command to program multiple memory cells coupled to different bit lines in a memory array;
storing data values to be programmed for the multiple memory cells in page buffers coupled to the different bit lines;
selecting different target voltages to apply to the different bit lines in response to data values; and
responsive to the program command, applying the different target voltages at a same time to the different bit lines coupled to the multiple memory cells.

5. The method of claim 4, including
selecting the different target voltages at the same time for the different bit lines.

6. The method of claim 4,
wherein the different target voltages are different bit line program voltage levels, such that responsive to the program command, different bit line program voltage levels are set at the same time for the different bit lines.

7. The method of claim 4,
wherein the different target voltages are different bit line program verify voltage levels, such that responsive to the program command, different bit line program verify voltage levels are set at the same time for the different bit lines.

8. A memory device, comprising:
a page buffer circuit of a bit line in a memory array, including:

a plurality of memory elements storing a plurality of bits;

a plurality of electrical inputs of the page buffer circuit, different ones of the plurality of electrical inputs corresponding to different signals that result in different bit line voltages of the bit line; and a selection circuit that, based on the plurality of bits in the plurality of memory elements, selects a particular electrical input of the plurality of electrical inputs.

9. The device of claim 8, wherein the different signals at the plurality of electrical inputs correspond to different program levels on the bit line, such that the selection circuit selecting the particular electrical input of the plurality of electrical inputs, results in selecting the one of the different program levels on the bit line.

10. The device of claim 8, wherein the different signals at the plurality of electrical inputs correspond to different program verify levels on the bit line, such that the selection circuit selecting the particular electrical input of the plurality of electrical inputs, results in selecting the one of the different program verify levels on the bit line.

11. The device of claim 8, further comprising:

control circuitry sending control signals to store the plurality of bits in the plurality of memory elements, and to cause the selection circuit to select the particular electrical input.

12. The device of claim 8, further comprising:

control circuitry, that responsive to a program command to store a particular data value to a memory cell coupled to the bit line, causes the bit line to have said one of the bit line voltages that corresponds to the particular data value.

* * * * *